United States Patent [19]

Anantha et al.

[11] Patent Number: 4,492,008

[45] Date of Patent: Jan. 8, 1985

[54] METHODS FOR MAKING HIGH PERFORMANCE LATERAL BIPOLAR TRANSISTORS

[75] Inventors: Narasipur G. Anantha, Hopewell Junction; Tak H. Ning, Yorktown Heights; Paul J. Tsang, Poughkeepsie, all of N.Y.

[73] Assignee: International Business Machines Corporation, Armonk, N.Y.

[21] Appl. No.: 520,366

[22] Filed: Aug. 4, 1983

[51] Int. Cl.³ .................... H01L 27/08; H01L 21/76
[52] U.S. Cl. ..................................... 29/571; 29/578; 29/576 W; 148/1.5; 148/175; 148/186; 357/35; 357/49; 357/55
[58] Field of Search .................... 29/571, 576 W, 578; 148/1.5, 175, 174, 186, 187, 188, 171; 357/49, 50, 34, 35, 44, 55

[56] References Cited

U.S. PATENT DOCUMENTS

| | | | |
|---|---|---|---|
| 3,524,113 | 8/1970 | Augusta et al. | 357/44 |
| 3,615,939 | 10/1971 | Schneider et al. | 29/571 |
| 3,971,059 | 7/1976 | Dunkley et al. | 357/44 |
| 4,089,992 | 5/1978 | Doo et al. | 427/94 |
| 4,104,086 | 8/1978 | Bondur et al. | 148/1.5 |
| 4,159,915 | 7/1979 | Anantha et al. | 29/576 W X |
| 4,180,827 | 12/1979 | Gates | 357/35 X |
| 4,196,440 | 4/1980 | Anantha et al. | 357/35 |
| 4,339,767 | 7/1982 | Horng et al. | 357/35 X |
| 4,378,630 | 4/1983 | Horng et al. | 29/578 X |

OTHER PUBLICATIONS

N. G. Anantha et al., "IBM Technical Disclosure Bulletin, vol. 21, No. 7, Dec. 1978, pp. 2753 and 2754.
P. J. Tsang, IBM Technical Disclosure Bulletin, vol. 22, No. 10, Mar. 1980, pp. 4523 through 4525.
J. S. Lechaton, et al., "A Model for Etching of Silicon in Cl₂/Ar Plasma" in Plasma Process-Proceedings Symposium on Plasma Etching and Deposition.
R. G. Frieser et al., the Electrochemical Society 1981, pp. 75 through 85, L. M. Ephrath, J. Electrochem. Society, vol. 124, p. 284C(1977).
1983 IEEE International Solid-State Circuits Conference, "Session IX: Fast Ram's", pp. 108 through 109.

*Primary Examiner*—Brian E. Hearn
*Assistant Examiner*—David A. Hey
*Attorney, Agent, or Firm*—George O. Saile

[57] ABSTRACT

A high performance lateral transistor may be fabricated by first providing a monocrystalline semiconductor body having a principal surface and where the desired transistor is a PNP transistor, a buried N+ region with an N+ reach-through connecting the buried region to said principal surface. The collector region of the transistor is formed into the surface by blanket diffusing P type impurities into the desired region. An insulating layer is formed upon the top surface of the semiconductor body. An opening is made in the insulating layer where the groove or channel-emitter contact is desired. An etching of a substantially vertical walled groove into the monocrystalline semiconductor body using the patterned insulating layer as the etching mask. An N base diffusion is carried out to produce as N region around the periphery of the opening in the body. Oxygen is then ion implanted into the bottom of the groove to form a silicon dioxide region at the bottom of the groove. The P+ polycrystalline silicon layer is then formed on the surface which will in turn fill the groove with this material. The heating of the structure forms the P+ emitter region around the side edges of the P+ polycrystalline silicon filled groove. The P+ polycrystalline layer is the emitter contact, the N+ reach-through connected through the buried N+ region is the base contact and the collector contact is made to the P-type collector region.

13 Claims, 8 Drawing Figures

METHODS FOR MAKING HIGH PERFORMANCE LATERAL BIPOLAR TRANSISTORS

DESCRIPTION

1. Technical Field

This invention relates to the fabrication of lateral bipolar transistors and, more particularly to the fabrication of lateral transistor with or without a vertical bipolar transistor combination therewith.

2. Cross-Reference to Related Application

Patent Application Ser. No. 520,365, filed Aug. 4, 1983, entitled "Structures and Fabrication Methods for High Performance Lateral Bipolar Transistors", by N. G. Anantha, J. Riseman and P. J. Tsang (FI 9-82-067).

3. Background Art

Complementary bipolar integrated circuits having for example, PNP transistors and NPN transistors are potentially desirable in digital logic applications. However, the manufacturing of complementary bipolar structures in integrated circuits have been somewhat difficult and the approaches to overcome the manufacturing problems have been to fabricate a combination of vertical NPN transistor and lateral PNP transistor simultaneously. Example of this type of complementary device and fabrication may be seen in the B. Agusta, et al., U.S. Pat. No. 3,524,113 in wherein one embodiment the lateral PNP and vertical NPN devices are formed within the same monocrystalline silicon pocket and have a common vertical NPN collector and lateral PNP base. Another example of this type of complementary structure may be seen in J. L. Dunkley, U.S. Pat. No. 3,971,059 where in the lateral structure, the N type epitaxial layer comprises the base with the emitter and collector regions both located within the base and spaced apart from each other. Both emitter and collector regions of the lateral PNP transistor are formed during the diffusion steps used to form the base region of the double-diffused vertical NPN transistor. Therefore, there are no high temperature processing steps after the formation of the NPN transistor. A still further example is shown in the N. G. Anantha, et al., U.S. Pat. No. 4,196,440 wherein the lateral PNP and vertical NPN devices are located in monocrystalline silicon pockets, wherein the silicon dioxide isolation surrounds the pocket and partially, below the surface, within the isolated monocrystalline region.

Independent lateral PNP devices have also been described in the art. For example, W. C. Schneider U.S. Pat. No. 3,615,939 illustrates such a lateral transistor device wherein the device is partially formed within the side periphery of a channel. A diffused collector region and base region surrounds this emitter peripheral area. The N. G. Anantha, et al., IBM Technical Disclosure Bulletin Vol. 21, No. 7, December 1978, Page 2753 and 2754 describes a lateral PNP device wherein the emitter and base regions are formed by an outdiffusion from a polycrystalline silicon pattern. This polycrystalline silicon pattern is then utilized as the ohmic contact to the resulting diffused regions.

While these devices described in the above paragraphs had been used in the past there are basic deficiencies in all such fabrication processes and the resulting lateral PNP devices and their combination in complementary integrated circuits with vertical NPN devices for complementary circuits. There are basically two main reasons why the lateral PNP transistor is a low gain device. First, the base width $W_b$ which is a critical perimeter in determining both current gain and cut-off frequency, is determined by the lithographic capability and is usually very large as compared with that of vertical NPN transistors. For example, $W_b$ for conventional lateral PNP transistors is larger than 1.0 micrometers. Second, there is a parasitic diode for parasitic PNP transistor between the base and emitter of lateral PNP transistors which greatly reduces the current gain for the transistors. The extent that the lateral PNP transistor's current gain is reduced by this parasitic transistor is increased with the size of the parasitic transistor which, in turn, is proportional to the bottom face area of the lateral PNP transistor's emitter region. Therefore, in order to increase current gain of a lateral PNP, both the base width and the emitter region of the transistor must be minimized.

It is the object of this invention to provide fabrication methods to minimize the base width and the emitter region size of the lateral transistor.

It is a further object of this invention in one embodiment to almost totally eliminate the parasitic transistor in the lateral transistor by use of a buried silicon dioxide isolation below the emitter contact for the lateral transistor.

A high performance lateral transistor may be fabricated by first providing a monocrystalline semiconductor body having a principal surface and where the desired transistor is a PNP transistor, a buried N+ region with an N+ reach-through connecting the buried region to said principal surface. The collector region of the transistor is formed into the surface by blanket diffusing P type impurities into the desired region. An insulating layer is formed upon the top surface of the semiconductor body. An opening is made in the insulating layer where the groove or channel emitter contact is desired. An etching of a substantially vertical walled groove into the monocrystalline semiconductor body using the patterned insulating layer as the etching mask. An N base diffusion is carried out to produce as N region around the periphery of the opening in the body. Oxygen is then ion implanted into the bottom of the groove to form a silicon dioxide region at the bottom of the groove. The P+ polycrystalline silicon layer is then formed on the surface which will in turn fill the groove with this material. The heating of the structure forms the P+ emitter region around the side edges of the P+ polycrystalline silicon filled groove. The P+ polycrystalline layer is the emitter contact, the N+ reach-through connected through the buried N+ region is the base contact and the collector contact is made to the P-type region.

The method for fabricating the vertical NPN and lateral PNP transistors in the same semiconductor body involves providing a P monocrystalline semiconductor substrate, a pattern of N+ regions in the substrate and growing an N epitaxial layer on the surface of the substrate having the N+ regions. The N+ region will grow into the epitaxial layer from the substrate during the growth of the epitaxial layer to form the buried N+ regions. Isolated regions of monocrystalline semiconductor are formed in the substrate having the epitaxial layer thereon wherein at least one of the pattern of said N+ regions is located within the regions designated to have NPN and PNP devices formed therein. The designated lateral PNP surface areas are dielectrically isolated from the designated base-emitter region of the NPN surface areas and the designated common N+ reach-through connected to the N+ buried layer. The devices are then formed within the same monocrystalline semiconductor isolated region. The lateral transistor is formed as described in the above paragraph. Contacts are made to the PNP and NPN transistors wherein one portion of the first P+ polycrystalline silicon layer is the lateral PNP emitter contact, a second portion of the first polycrystalline silicon layer is the vertical NPN extrinsic base contact, the N+ polycrystalline silicon layer is the vertical NPN emitter contact, the N+ reach-through from the surface makes a common contact through the N+ buried layer to the base region of the PNP and the collector region of the NPN, and the lateral PNP collector contact is made to the P-type region.

DISCLOSURE OF THE INVENTION

Figure 1:
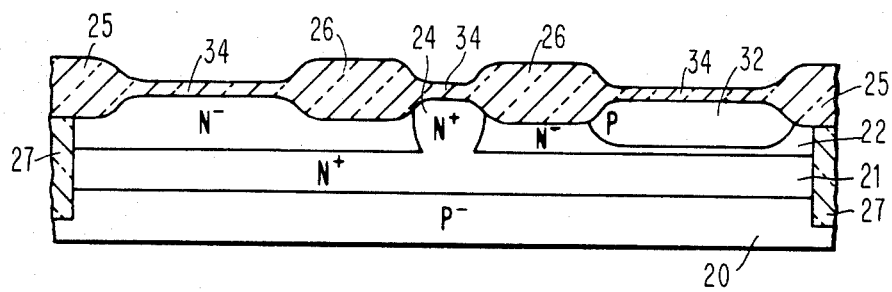
FIGS. 1 through 7 illustrate an embodiment for fabricating the high performance a complementary bipolar transistor structure.
Figure 2:
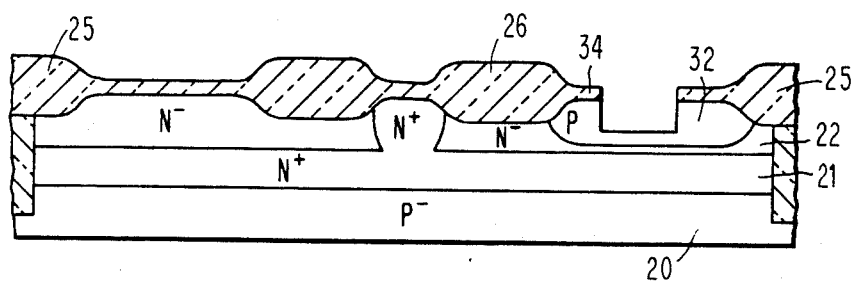

Referring now more particularly to FIGS. 1 through 7, the manufacturing steps for the complementary bipolar transistors utilizing the present method is described. FIG. 1 illustrates one small, greatly enlarged portion of a silicon body which will be used to form a very dense bipolar integrated circuit. A P-substrate of monocrystalline silicon 20 has a blanket subcollector N+ diffusion 21 made therein. An epitaxial N layer 22 is then grown on top of the substrate. These processes are standard processes in the formation of, for example, NPN bipolar transistors. The substrate is typically a <100> crystallographic orientation silicon wafer having a resistance of the order of 10 to 20 ohm-cm. The subcollector diffusion is typically formed using arsenic having a surface concentration of about $10^{20}$ atoms/cm$^3$. The epitaxial growth process to form layer 22 may be by conventional techniques, such as the use of SiCl$_4$/H$_2$ or SiH$_4$ mixtures at temperatures about 1000° C. to 1200° C. During the epitaxial growth the dopant in the N+ layer moves into the epitaxial layer. The thickness of the epitaxial layer for highly dense integrated circuits is of the order of 3 micrometers or less.

The next series of steps involves the formation of isolation means for isolating regions of monocrystalline silicon from other regions of monocrystalline silicon. The isolation may be by back biasing PN junctions, partial dielectric isolation or complete dielectric isolation. The dielectric materials used may be silicon dioxide, glass, etc. The preferred isolation for highly dense integrated circuits is dielectric isolation. The FIG. 1 shows partial dielectric isolation with dielectric regions 25 isolating monocrystalline silicon regions of the silicon body from one another and a region 26 which isolates the base-emitter region from the collector reach-through region. There are many ways in the art to form dielectric regions of this type. One such process is described in the J. A. Bondur, et al. U.S. Pat. No. 4,104,086, issued Aug. 1, 1978 and assigned to the assignee of the present patent application. In that patent application the process for forming partial dielectric isolation for regions 25 and 26 is described in detail. Also, it is preferred to have extended isolation regions 27 extending through the epitaxial layer 22 and subcollector layer 21 into the substrate 20. These regions 27 may be formed by reactive ion etching through the various layers and into the substrate. Then, the openings may be filled by thermal oxidation and/or combination with chemical vapor deposition of any one or combination of materials such as silicon dioxide, silicon nitride, polycrystalline silicon, etc. The N+ reach-through region 24 may be formed at this time by using a silicon dioxide or photoresist mask. Alternatively, region 24 can be formed at a later point in the process.

A boron diffusion or preferably ion implantation is made with a dosage level/energy suitable for the lateral PNP transistor. A P type region is implanted in the total device region as region 32. The block-out resist mask (not shown) may be used to prevent the ions from entering the non-lateral PNP areas.

A base-emitter opening is formed in insulator layer 34 which is typically thermally grown silicon dioxide by lithography and etching techniques. The exposed P region 32 of the lateral PNP transistor is now anisotropically reactive ion etched by placing the structure in a suitable silicon etching ambient to produce the FIG. 2 structure. Conventional gases or gas mixtures for reactive ion etching of silicon, e.g. Cl$_2$, SF$_6$CF$_4$, CCl$_2$F$_2$ plus oxygen, etc., may be used. The depth of the emitter trench etched can be monitored by timing or by conventional laser interference detection techniques. The depth of the reactive ion etched trench is between about 0.5 to 2.0 micrometers. The deepest depth dimension is about the same as the depth of the P region 32 in order to maximize the vertical emitter surface area of the lateral PNP transistor. The remaining surfaces of the structure are protected by insulating layers not adversely affected by the reactive ion etching process.

Figure 3:
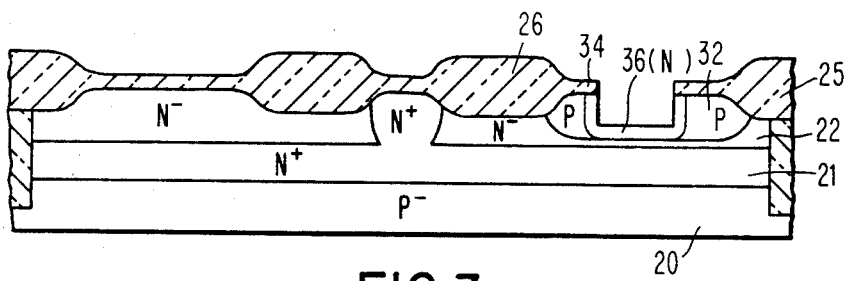

An N type initial base diffusion is carried out to form N region 36 around the entire periphery of the opening as seen in FIG. 3. Conventional phosphorus diffusion process, such as using POCl$_3$ for deposition at 650° C. followed by drive in diffusion at 900° to 1000° C. may be used.

Figure 4:
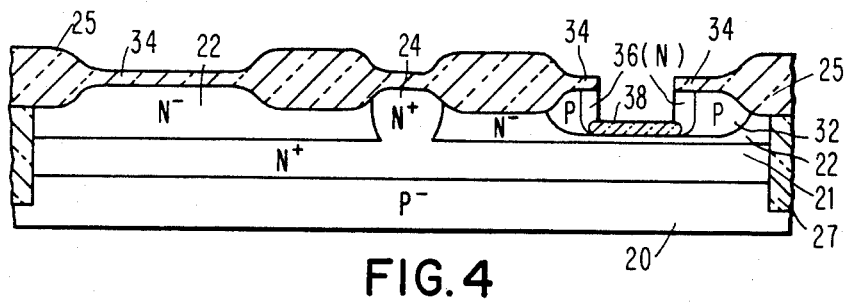

A buried silicon dioxide isolation region 38 is now formed by an oxygen ion implantation method on the bottom of the emitter trench. During this process the base region 36 is extended further into P region 32 and oxidized at the bottom of the groove as seen in FIG. 4. The thickness of the silicon dioxide layer 38 is between about 0.5 to 1.5 micrometers. This can be done by oxygen implantation, at a dosage of $1 \times 10^{13}$ to $1 \times 10^{16}$ atoms/cm$^2$ and at a power of between about 50 to 200 KeV followed by thermal annealing at between about 600° to 1000° C. in nitrogen for about 20 to 40 minutes. More details of this oxygen ion implantation process may be formed in the IBM TDB Vol. 22, Pages 4523-4525.

An opening is made in insulating layer 34 where the designated emitter-base regions of the vertical NPN transistor is to be formed by conventional lithography and etching techniques.

There is now deposited a first polycrystalline silicon layer 40 over the entire surface having the surface isolation pattern 25, 26 and openings to the vertical and lateral transistor areas of monocrystalline silicon. The first polycrystalline silicon layer 40 may be deposited by any of a variety of techniques one of which is by way of example using silane in a temperature range of about 500° to 1000° C. and preferably about 600° C. The operative thickness of the polycrystalline silicon layer is between about 50 to 300 nanometers with about 50 to 100 nanometers preferred. The polycrystalline silicon layer in this embodiment is in direct contact with the monocrystalline silicon body in the vertical NPN designated emitter-base area and lateral PNP designated emitter area. The polycrystalline silicon layer 40 may be doped as deposited or may be deposited substantially undoped and then doped by a subsequent ion implantation and heating process. The ion implantation dosage in this process is between about $1 \times 10^{14}$ to $1 \times 10^{15}$ ions/cm$^2$ at 50 to 80 KeV.

An insulator layer 42 is now deposited over the first polycrystalline silicon layer 40. Where the layer 42 is composed of silicon dioxide, it may be chemically vapor deposited in, for example, using SiH$_4$Cl$_2$ and N$_2$O at a temperature of about 800° C. or less under atmospheric or low pressure conditions. The operative thickness of the silicon dioxide layer is between about 50 to 500 nanometers and a preferred thickness of 150 to 300 nanometers. Alternatively, the layer 42 may be composed of silicon nitride or a combination of layer of silicon dioxide and silicon nitride. A deposition of the silicon nitride layer is usually formed by chemical vapor deposition using the process conditions of silane, ammonia and nitrogen carrier gas at a temperature of about 800° C. or higher using atmospheric or low pressure conditions as discussed in the V. Y. Doo U.S. Pat. No. 4,089,992. The operative thickness of the silicon nitride layer is between about 10 to 200 nanometers and 50 nanometers is preferred. The layered structure 40, 42 is patterned by conventional lithographic and etching techinques. However, it is important that the edges of the patterned structure 40, 42 are substantially vertical. Therefore, anisotropic reactive ion etching is the preferred etching process.

The etching step utilized for the layered structure 42, and 40 is preferably an anisotropic etching process utilizing carbon tetrafluoride or chlorinated hydrocarbon gases such as described in J. S. Lechaton and J. L. Mauer "A Model for Etching of Silicon in Cl$_2$/Ar Plasma" in Plasma Process-Proceedings Symposium on Plasma Etching and Deposition, R. G. Frieser et al., the Electrochemical Society 1981, pp. 75-85. It may be preferable to use different etchants for each of the layers such as carbon tetrafluoride, CF$_4$, for silicon nitride, CF$_4$—H$_2$ for silicon dioxide and CF$_4$ for polycrystalline silicon.

Figure 5:
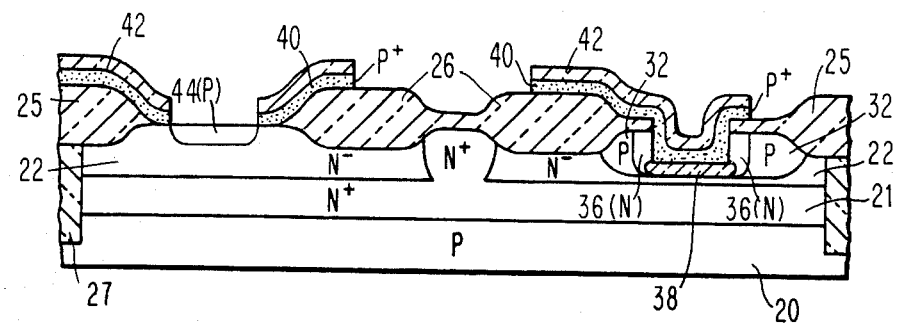

The vertical NPN intrinsic base region doping level is set by diffusion or ion implantation of boron ions to form P+ regions 44 in the N− epitaxial region 22 as seen in FIG. 5. The surface concentration of region 44 is of the order of $1 \times 10^{18}$ to $1 \times 10^{19}$ atoms/cm$^3$.

Figure 6:
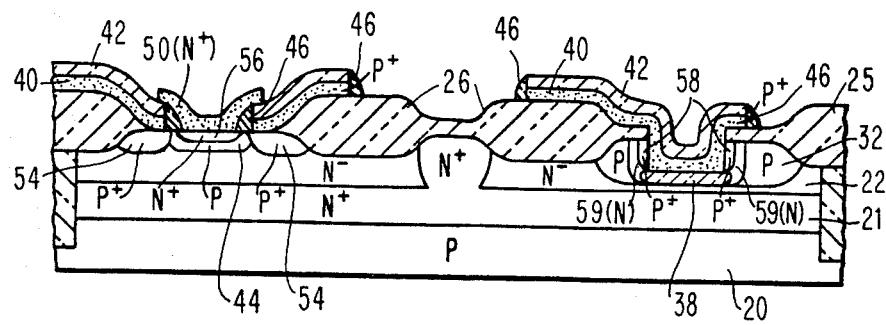

A sidewall insulator layer 46 is formed upon vertical sidewalls of the layered structure 42 and 40. This layer 46 is preferably silicon dioxide. However, the layer may alternatively be composed of silicon nitride, or the like or combinations of these insulators with silicon dioxide. A silicon dioxide layer may be formed by a vapor deposition process wherein silane and oxygen at 450° C. is used or SiH$_2$Cl$_2$ and N$_2$O at a temperature of about 800° C. under atmospheric or low pressure conditions are utilized. This layer is uniformly deposited to a precise thickness over the layers 42, 40 on both the horizontal and vertical surfaces thereof. This layer 46 is then subjected to preferential removal from the horizontal surfaces while substantially leaving the layer upon the substantially vertical sidewalls in an anisotropic etching ambient. The etching may be done, for example, in a reactive ion etching system using CF$_4$ and H$_2$ gases as described in L. M. Ephrath, J. Electrochem. Society, Vol. 124, p. 284C(1977). The result of the sidewall formation is shown in FIGS. 6. A thickness of the sidewall 46 is preferably between about 30 to 500 nanometers.

There is now deposited a second polycrystalline silicon layer 50 over the entire surface of the FIG. 6 structure. The second polycrystalline layer 50 may be deposited as described above for the first polycrystalline silicon layer and have conductivity inducing impurities implanted therein the same way as described in regard to the first polycrystalline silicon layer. However, the second polycrystalline silicon layer is doped with N+ impurities such as arsenic or phosphorous. The structure 50 is patterned by conventional lithography and etching techniques. The lithographic and etching techniques result in leaving the N+ polycrystalline silicon layer 50 only above the emitter designated area for the vertical NPN transistor. The polycrystalline silicon layer is formed directly upon the monocrystalline silicon surface at this point as shown in the FIG. 6 structure.

A dopant drive-in is carried out in nitrogen or argon atmosphere at a temperature of about 800° to 1000° C. for a time of about 10 to 60 minutes to form: the extrinsic base region 54 of the vertical NPN transistor, the N+ emitter region 56 of the vertical NPN transistor, and the emitter 58 and base 59 of the lateral PNP transistor. In addition, the base diffusion region 44 of the vertical NPN transistor is also driven further into the epitaxial layer 22. The structure is shown in FIG. 6. The emitter base junction depth is about 50 to 500 nanometers. The base width is of the order of about 100 to 500 nanometers.

Figure 7:
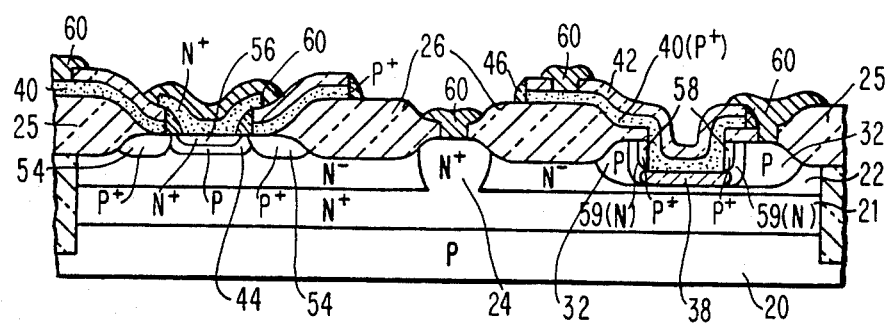
Figure 8:
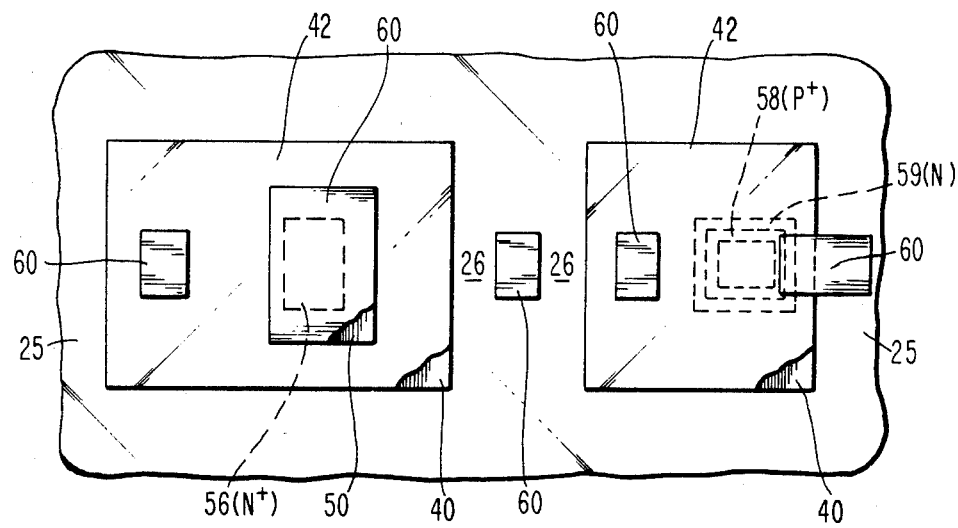
FIG. 8 shows a top view of the FIG. 7 structure.

The contact openings through layer 34 to the collector of the lateral PNP, through layer 42 to the lateral PNP emitter by way of P+ polycrystalline silicon layer 40, through layer 42 to the vertical NPN base by way of P+ polycrystalline silicon layer 40, and through layer 34 to the N+ common contact region 24 for the NPN collector and PNP base. Suitable next level metallurgy 60 such as aluminum, aluminum-copper, tantalum and the like may be blanket deposited and lithographically patterned for the desired next level electrical connections as seen in FIG. 7. FIG. 8 illustrates a top view of the FIG. 7 structure.

The structure has zero parasitic lateral PNP transistor effects due to the presence of the insulating layer 38. The base width can be made very narrow and the emitter-base gradient is also high. These characteristics give high performance switching.

A common base-collector structure as above described can be used for desirable circuit applications. For example, the PNP device can be used as an active load in a memory cell. This application can better be understood with reference to 1983 IEEE International Solid-State Circuits Conference, "SESSION IX: FAST RAM's" pg. 108 through 109. Further, I$^2$L (Integrated Injection Logic) or MTL (Merged Transistor Logic) has common NPN collector and PNP base contact. While the invention has been particularly shown and described with reference to preferred embodiments thereof it will be undrestood by those skilled in the art that various changes in form and detail may be made therein without departing from the spirit and scope of the invention. For example, the lateral PNP transistors described in the embodiment and illustrated in the drawings as part of a complementary bipolar structure with a vertical NPN transistor may obviously be utilized separately without any vertical transistors. Further, vertical PNP bipolar transistors can be formed rather than vertical NPN transistors illustrated by simply using the opposite conductivity types for each of the regions described. Also, the lateral PNP transistor can have the reversal of conductivity types for each of these regions to form lateral NPN transistors. Still further, metal silicide contacts can be formed on the surfaces of the polycrystalline silicon layers for higher level contacts to these elements.

What is claimed is:

1. Method of fabricating a high performance lateral PNP transistor comprising:
 providing a monocrystalline semiconductor body having a principal surface of N conductivity type and a buried N+ region with an N+ reach-through connecting said buried region to said surface;
 forming the collector region of said transistor into said surface by diffusing P type impurities into the desired region of said body;
 etching a substantially vertical walled groove in said monocrystalline semiconductor body in the area designated to be on the emitter contact;
 thermally diffusing N type impurities into the edges and bottom of said groove;
 ion implanting oxygen into the bottom of said groove to form a silicon dioxide region at the bottom of the groove;
 forming a P+ polycrystalline silicon layer over said surface so that portions of the layer are in direct contact with said groove;
 forming an insulator layer upon the top surface of said polycrystalline silicon layer;
 patterning said polycrystalline silicon layer and insulator layer with substantially vertical edges wherein the layer remains over areas designated to be the emitter regions of said lateral PNP transistor;
 heating the structure to form the P+ emitter region around the side edges of the said P+ polycrystalline silicon filling said groove; and
 making electrical contact to the collector, the emitter through said P+ polycrystalline layer and the base through an N+ reach-through to said buried N+ region.

2. The method of claim 1 wherein the said lateral PNP transistor is formed within a portion of said monocrystalline body that is dielectrically isolated from similar such portions.

3. The method of claim 1 wherein a vertical NPN transistor is simultaneously formed with said lateral PNP transistor in another portion of said monocrystalline body dielectrically isolated at the surface from that of said lateral PNP transistor.

4. The method of claim 3 wherein said semiconductor body includes a P type monocrystalline substrate, a pattern of buried N+ regions located in the portions of said body designated to have vertical NPN transistors and lateral PNP transistors and an N type epitaxial layer thereover, to provide said principal surface of N conductivity type, wherein said pattern of N+ regions are isolated from one another and the base of said lateral PNP and collector of said vertical NPN are electrically connected by said buried N+ layer and to the surface by said N+ reach through region.

5. The method of claim 1 wherein the said insulator layer upon the first polycrystalline silicon layer is silicon dioxide, said vertical insulator on said first polycrystalline silicon layer is formed by depositing a conformal coating and anisotropically etching said coating to remove the horizontal portions of said coating while leaving said vertical insulator on said first polycrystalline silicon layer.

6. The method of claim 1 wherein said etching is by anisotropic reactive ion etching and continues to a depth about equal to the depth of the said collector region.

7. The method of claim 6 wherein said reactive ion etching ambient is $CCl_2F_2$ and $O_2$.

8. The method of claim 1 wherein the said silicon dioxide region at the bottom of the groove is completely formed by subsequent annealing of the structure at a temperature between about 600° to 1000° C. after said ion implanting.

9. The method for fabricating vertical NPN and lateral PNP transistors in the same semiconductor body comprising:
 providing a P monocrystalline semiconductor substrate;
 forming a pattern of N+ regions in said substrate;
 growing an N epitaxial layer on the surface of said substrate having said N+ regions;
 forming isolated regions of monocrystalline semiconductor in said substrate having said epitaxial layer thereon wherein one of said pattern of said N+ regions is within the isolated regions designated to have NPN and PNP devices formed therein;
 forming an N+ reach-through region to connect one of said pattern of N+ region with the surface of said epitaxial layer;
 forming a blanket P region at the surface of the region designated as the lateral PNP;
 etching a substantially vertical walled groove in said monocrystalline silicon body;
 thermally diffusing N type impurities into edges and bottom of said groove;
 ion implanting oxygen into the bottom of said groove to form a silicon dioxide region at the bottom of the groove;
 forming a P+ polycrystalline silicon layer on the surface of said epitaxial layer in the designated vertical NPN base-emitter area.

10. The method of claim 9 wherein pair of the said vertical and lateral transistors are formed within a portion of said epitaxial layer that is dielectrically isolated from other such portions.

11. The method of claim 9 wherein said etching is by anisotropic reactive ion etching and continues to a depth of about equal to the depth of said collector region.

12. The method of claim 11 wherein said reactive ion etching ambient is $CCl_2F_2$ and oxygen.

13. The method of claim 9 wherein the said silicon dioxide region at the bottom of the groove is completely formed by subsequent annealing of the structure at a temperature between about 600° and 1000° C. after said ion implanting.

* * * * *